United States Patent [19]
Yamamoto et al.

[11] 4,374,331
[45] Feb. 15, 1983

[54] D-TYPE FLIP-FLOP CIRCUIT

[75] Inventors: Yuji Yamamoto, Fujisawa; Sei Shiragaki, Yamato, both of Japan

[73] Assignee: Yamatake-Honeywell Co., Ltd., Tokyo, Japan

[21] Appl. No.: 227,562

[22] Filed: Jan. 22, 1981

[30] Foreign Application Priority Data

Jan. 24, 1980 [JP] Japan .................................. 55-6355

[51] Int. Cl.³ ...................... H03K 3/037; H03K 3/286
[52] U.S. Cl. .................................... 307/291; 307/443; 328/206
[58] Field of Search ............... 307/289, 291, 445, 443; 328/206, 196

[56] References Cited

U.S. PATENT DOCUMENTS 4,001,611 1/1977 Maruyama et al. ................. 307/291
4,093,878 6/1978 Paschal et al. ...................... 307/291

Primary Examiner—John Zazworsky
Attorney, Agent, or Firm—Laurence J. Marhoefer

[57] ABSTRACT

A delay circuit in a conventional D type flip-flop circuit sets a flip-flop to a predetermined logic state in the event of an internal circuit failure.

2 Claims, 6 Drawing Figures

PRIOR ART

D-TYPE FLIP-FLOP CIRCUIT

BACKGROUND OF THE INVENTION

The present invention relates to D-type flip-flop circuits and specifically to a D-type flip flop circuit (referred to as D-F/F, hereinafter) in which, when there is a failure in D-F/F, the failure sets the flip-flop to a predetermined logic state.

A D-type flip flop is a flip-flop whose output is a function of the input which appears one clock pulse earlier; for example, if a binary "1" appears at the input, the output after the next clock pulse will be a "1".

FIG. 1 shows an example of conventional D-F/F. In this Figure, symbols Q1, Q2, Q3 and Q4 represent NAND gates. The inputs to NAND gate Q1 are an input signal from terminal A and a clock signal on terminal B. NAND gate Q2 receives as inputs the output from the NAND gate Q1 and the clock signal.

The NAND gates Q3 and Q4 are cross connected to constitute a non-synchronous flip-flop circuit which receive, as its set input signal and its reset input signal, the outputs from the first and second NAND gates Q1 and Q2, respectively. The output from the D-F/F on terminal D can be set to an initial value (binary "1" or binary "0") by an initial set signal applied to terminal C.

The operation of this prior art D-F/F will be understood from the timing chart shown in FIG. 2A. The flip-flop is set initially by a signal on terminal C. Thereafter the D-F/F is set and reset by a combination of the input signal applied to terminal A and the clock input signal, so that an output signal as shown by waveform "output of F/F CKT" in FIG. 2A follows the input shifted by one clock pulse.

A problem with this prior art D-F/F arises if the output of the NAND gate Q1 is not applied to the NAND gate Q4 due to a failure, such for example as a burning out of the wire. In this case the D-F/F operates in the manner shown in FIG. 2B.

Namely, after the input signal changes from "1" to "0", the output signal changes from "1" to 37 0" and remains in this state.

According to the invention, in the event that the output signal is not obtained as the signal shifted from the input signal, the output is changed without fail from "1" to "0" before the input is changed to "0" and this state is maintained, thereby to find out beforehand that the apparatus is not functioning as a shift register, thereby to prevent the apparatus (not shown) using this D-F/F from operating erroneously.

DESCRIPTION OF THE INVENTION

Figure 1:
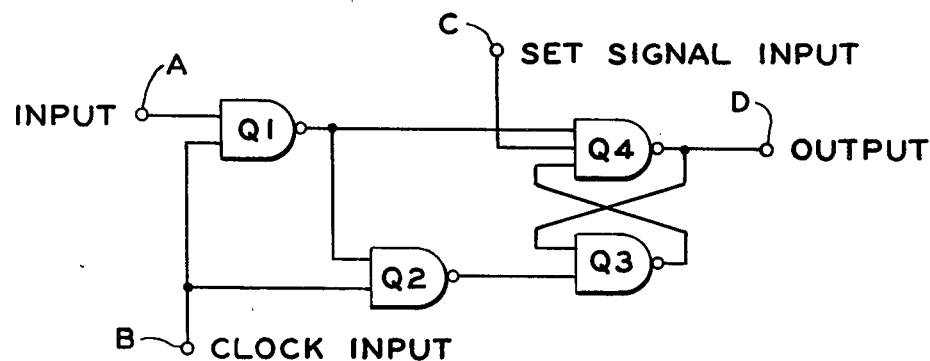
FIG. 1 shows an example of a conventional prior art D-type flip-flop circuit.
Figure 2A:
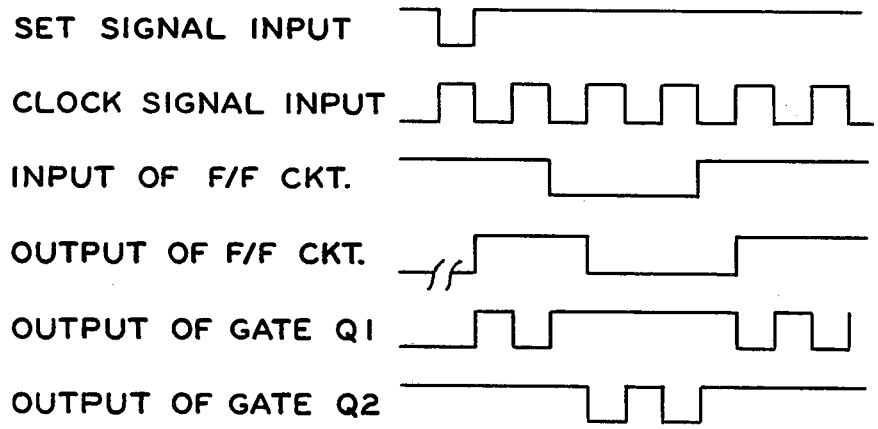
FIGS. 2A and 2B are timing charts for explaining the operations of the circuit shown in FIG. 1 in the event that there is no failure and in the event of a failure in the circuit, respectively.
Figure 2B:
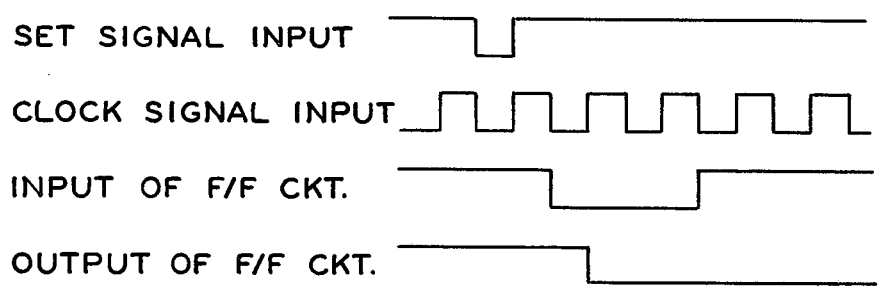
Figure 3:
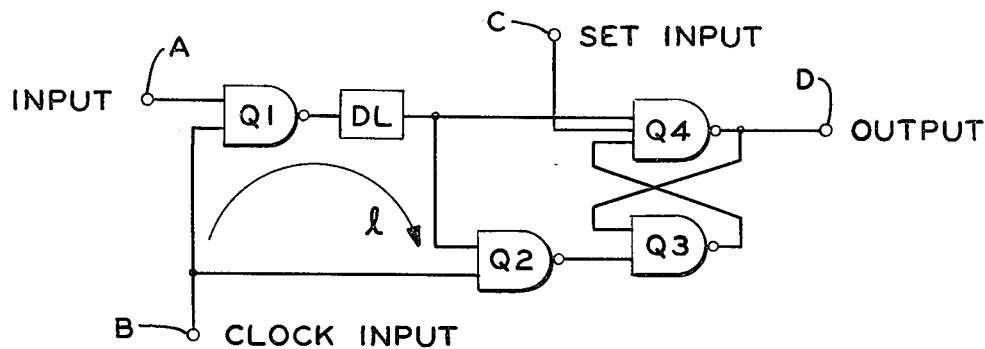
FIG. 3 shows a flip-flop circuit constructed in accordance with the invention.

FIG. 3 shows one embodiment of a D-F/F in accordance with the teachings of this invention. In the illustrated embodiment, the delay circuit DL is provided at the output side end of the NAND gate Q1, and the output of the NAND gate Q1 is transmitted through this delay circuit. Other portions are materially the same as those of D-F/F shown in FIG. 1.

The D-F/F shown in FIG. 3 operates in the following manner:

The delay time $T_D$ of the delay circuit DL is selected to be sufficiently large that each clock signal applies a reset and set pulse to the NAND gates Q3 and Q4 of the non-synchronous flip-flop. When the input at A is high (binary "1") a series of narrow pulses of width $T_D$ appear at the output D.

The delay circuit DL may be constructed by a suitable number of inverters connected in series, so that the delay time peculiar to the inverters is used as the delay time of the delay circuit.

Figure 4A:
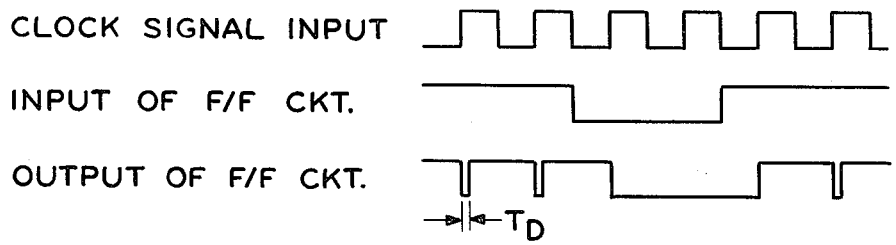
FIGS. 4A and 4B are timing charts for explaining the operation of the circuit shown in FIG. 3 in the event that there is no failure and in the event of a failure in the circuit, respectively.

Representing the delay time of this delay circuit DL by $T_D$, an output shown by "output" in FIG. 4A is obtained in response to an input of a wave form represented by "Input" in the same Figure.

Figure 4B:
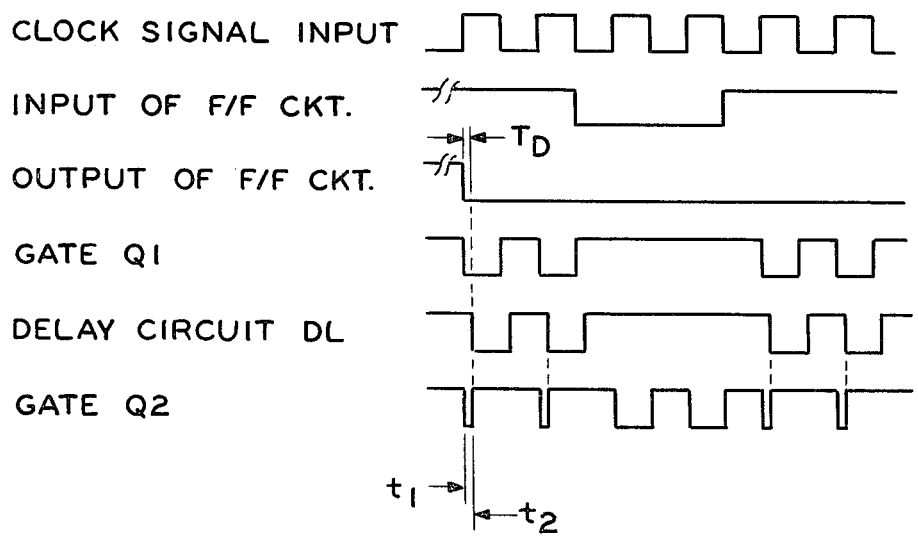

In the event that the output from the NAND gate Q1 is not transmitted to the NAND gate Q4 due to a failure, as mentioned before, if the output from the non-synchronous F/F is at the level "1" (established by "0" from the set input) the output is inverted to "0" by the reset signal from the NAND gate Q2. Thereafter, a signal from the NAND gate Q1 is not delivered at the set input, so that the output from the non-synchronous F/F stays at the level "0". The output is shown by wave form "output" shown in FIG. 4B. Although the input signal remains at binary level "1", the output is forcibly set to "0" before a change of the input signal.

Thus, the output initially set at "1" is immediately turned to "0" by the set input, and this state of output is maintained to inform an operator of the failure in the D-F/F, thereby to avoid erroneous operation of the apparatus using the output of the D-F/F.

In the described embodiment, the delay circuit DL is provided at the output side of the NAND gate Q1. However, it should be noted the delay circuit DL may be positioned at any portion in the line L. That is, it may also, for example, be positioned alternatively to delay the application clock pulse to $0_{12}$.

As has been described, according to the invention, the flip-flop circuit can check itself for any failure, simply by a provision of a delay circuit, so that various inconveniences which may be incurred by the failure in the circuit can easily be avoided.

What is claimed is:

1. A flip-flop circuit comprising:
    a first NAND gate having a pair of input terminals and an output terminal;
    means for coupling an input signal to one of said pair of first NAND gate input terminals;
    means for coupling a clock signal to the other of said pair of first NAND gate input terminals;
    a second NAND gate having a pair of input terminals and an output terminal;
    means for coupling said output terminal of said first NAND gate to one of said pair of second NAND gate input terminals;
    means for coupling said clock signal to the other of said pair of said second NAND gate input terminals;
    a non-synchronous flip-flop circuit having a set input terminal and a reset input terminal;

means for coupling said output of said first NAND gate to said set input terminal and means for coupling said output of said second NAND gate to said reset input terminal; and a delay circuit connected between the input of said second NAND gate and the output of said first NAND gate.

2. A flip-flop circuit comprising:

a first NAND gate having a pair of input terminals and an output terminal;

means for coupling an input signal to one of said pair of first NAND gate input terminals;

means for coupling a clock signal to the other of said pair of first NAND gate input terminals;

a second NAND gate having a pair of input terminals and an output terminal;

means for coupling said output terminal of said first NAND gate to one of said pair of second NAND gate input terminals;

means for coupling said clock signal to the other of said pair of said second NAND gate input terminals;

a non-synchronous flip-flop circuit having a set input terminal and a reset input terminal;

means for coupling said output of said first NAND gate to said set input terminal and means for coupling said output of said second NAND gate to said reset input terminal; and means for delaying an input signal to said second NAND gate from the output of said first NAND gate with respect to said clock signal input coupled to said second NAND gate input terminal.

* * * * *